United States Patent
Ke et al.

(10) Patent No.: US 9,847,283 B1
(45) Date of Patent: Dec. 19, 2017

(54) SEMICONDUCTOR DEVICE WITH WETTABLE CORNER LEADS

(71) Applicant: Nexperia B.V., Eindhoven (NL)

(72) Inventors: Xue Ke, Kwai Chung (HK); Kan Wae Lam, Kwai Chung (HK); Sven Walczyk, Nijmegan (NL); Wai Keung Ho, Kwai Chung (HK); Wing Onn Chaw, Seremban (MY)

(73) Assignee: Nexperia B.V., Eindhoven (NL)

( * ) Notice: Subject to any disclaimer, the term of this patent is extended or adjusted under 35 U.S.C. 154(b) by 0 days.

(21) Appl. No.: 15/344,564

(22) Filed: Nov. 6, 2016

(51) Int. Cl.
*H01L 23/495* (2006.01)
*H01L 21/48* (2006.01)
*H01L 23/00* (2006.01)
*H01L 23/498* (2006.01)

(52) U.S. Cl.
CPC .... *H01L 23/49555* (2013.01); *H01L 21/4825* (2013.01); *H01L 21/4842* (2013.01); *H01L 23/4951* (2013.01); *H01L 23/49582* (2013.01); *H01L 23/49805* (2013.01); *H01L 24/48* (2013.01); *H01L 2224/48245* (2013.01)

(58) Field of Classification Search
CPC ........... H01L 23/49555; H01L 21/4825; H01L 21/4842; H01L 23/4951; H01L 23/49582; H01L 23/49805; H01L 24/48
See application file for complete search history.

(56) References Cited

U.S. PATENT DOCUMENTS

| | | | |
|---|---|---|---|
| 5,804,880 A | 9/1998 | Mathew | |
| 6,544,817 B2 | 4/2003 | Huat et al. | |
| 6,608,366 B1 | 8/2003 | Fogelson et al. | |
| 6,713,849 B2 | 3/2004 | Hasebe | |
| 6,885,086 B1 | 4/2005 | Fogelson et al. | |
| 7,060,535 B1 | 6/2006 | Sirinorakul et al. | |
| 7,183,630 B1 | 2/2007 | Fogelson et al. | |
| 7,384,820 B2 | 6/2008 | Munakata et al. | |
| 8,329,509 B2 | 12/2012 | Gong et al. | |
| 8,685,795 B2 | 4/2014 | Wang | |
| 8,809,121 B2 | 8/2014 | Li et al. | |
| 8,853,865 B2 * | 10/2014 | Narita ................ | H01L 21/4821 257/778 |
| 2002/0020929 A1* | 2/2002 | Kasuga ................ | H01L 21/565 257/787 |
| 2002/0177254 A1 | 11/2002 | Chow et al. | |

(Continued)

FOREIGN PATENT DOCUMENTS

| JP | 2009294719 | 10/2000 |
|---|---|---|
| WO | 2009125250 | 10/2009 |

OTHER PUBLICATIONS

Freescale Semiconductor, Inc., Application Note, Quad Flat Pack No-Lead (QFN), MicroDual Fiat Pack No-Lead (uDFN), AN1902, Rev. 4.0, Sep. 2008.

*Primary Examiner* — Karen Kusumakar
(74) *Attorney, Agent, or Firm* — Ohlandt, Greeley, Ruggiero & Perle, L.L.P.

(57) ABSTRACT

A semiconductor device has wettable corner leads. A semiconductor die is mounted on a lead frame. Die bonding pads are electrically connected to leads of the lead frame. The die and electrical connections are encapsulated with a mold compound. The leads are exposed and flush with the corners of the device. The leads include dimples so that they are wettable, which facilitates inspection when the device is mounted on a circuit board or substrate.

14 Claims, 3 Drawing Sheets

(56) References Cited

U.S. PATENT DOCUMENTS

| | | |
|---|---|---|
| 2003/0143819 A1 | 7/2003 | Hedler et al. |
| 2005/0116321 A1 | 6/2005 | Li et al. |
| 2005/0139982 A1 | 6/2005 | Fukaya et al. |
| 2005/0212116 A1* | 9/2005 | Shimanuki .......... H01L 23/3107 257/702 |
| 2006/0141677 A1 | 6/2006 | Munakata et al. |
| 2008/0268578 A1 | 10/2008 | Shimanuki et al. |
| 2009/0215247 A1 | 8/2009 | Sato et al. |
| 2010/0072591 A1 | 3/2010 | Camacho |
| 2011/0108965 A1* | 5/2011 | Hess .................. H01L 21/4842 257/676 |
| 2012/0126378 A1* | 5/2012 | San Antonio ......... H01L 21/561 257/659 |
| 2014/0001616 A1* | 1/2014 | Daniels ................. H01L 24/97 257/676 |
| 2015/0076690 A1 | 3/2015 | Yoshino |
| 2016/0027694 A1 | 1/2016 | Truhitte et al. |
| 2016/0148876 A1* | 5/2016 | Kitnarong ............... H01L 24/83 257/666 |

\* cited by examiner

SEMICONDUCTOR DEVICE WITH WETTABLE CORNER LEADS

BACKGROUND

The present invention relates to semiconductor packaging and, more particularly, to a semiconductor device having solder wettable corner leads or 'flanks' to facilitate inspection of solder joints when the semiconductor device is mounted on a substrate or circuit board using a surface-mount technology (SMT) process.

A typical semiconductor device comprises a semiconductor die attached to a lead frame flag. Bonding pads on the die are electrically connected to leads of the lead frame with bond wires. This assembly is encapsulated with a mold compound, which protects the die and wire bonds from environmental and physical damage. In some packages, the leads extend outward from the sides of the package, while in others such as the Quad Flat No leads (QFN) or Dual Flat No leads (DFN), the leads are flush with the sides of the package body. For example, during assembly, an array of packages are assembled simultaneously. After the molding or encapsulation step, individual devices are formed with a saw singulation step, where adjacent devices are separated using a saw. These device are non-wettable at their flanks due to the untreated copper surface that is exposed yet flush with the side walls of the device. That is, due to the manner in which the semiconductor packages are singulated with a saw blade, the surface of the exposed lead or flank is flush with the mold compound of the device such that solder does not readily climb-up or "wick" the flank of the package meaning that the QFN package is not flank wettable. This makes it difficult to inspect the solder joints after the package has been attached to a substrate or circuit board.

In order to overcome this deficiency, current leadless plastic packages with side solderable terminals have solderable flanks in the package side walls. However, this design cannot be applied to ultra-small packages (≤1 mm×1 mm) with multiple I/O terminals and a large I/O pitch (0.4 mm) because the package is not large enough to accommodate multiple terminals in the side walls.

Accordingly, it would be desirable to have an ultra-small leadless package with wettable flanks to facilitate inspection of solder joints when the package is mounted such as to a printed circuit board (PCB) using an SMT process.

BRIEF DESCRIPTION OF THE DRAWINGS

The following detailed description of a preferred embodiment of the invention will be better understood when read in conjunction with the appended drawings. The present invention is illustrated by way of example and is not limited by the accompanying figures in which like references indicate similar elements. It is to be understood that the drawings are not to scale and have been simplified for ease of understanding the invention.

DETAILED DESCRIPTION

In one embodiment, the present invention provides a method of assembling a flank wettable semiconductor device. The method includes providing an array of rectangular lead frames, wherein individual lead frames are separated by saw streets and each lead frame has leads that extend to corners of the lead frame such that each lead has an end that abuts two adjacent, perpendicular saw streets. The lead frame is etched along the saw streets such that dimples are formed at the end of each of the leads. Semiconductor dies are mounted on and attached to respective ones of the lead frames. Then, bond pads on the dies are electrically connected with respective ones of the leads of the lead frames upon which the dies are mounted. The dies and the electrical connections are encapsulated with a mold compound and then the lead frame array is cut along the saw streets to separate individual devices from adjacent devices. Each device has corner bond pads that are flush with the mold compound and the dimples of each lead are exposed after the cutting.

In another embodiment the present invention provides a flank wettable semiconductor device. The device comprises a lead frame including a plurality of leads, and a semiconductor die mounted on the lead frame. Bonding pads on the die are electrically connected to respective ones of the leads. A mold compound encapsulates the die, the leads and the electrical connections. Ends of the leads are exposed at corner side walls of the device. The exposed portion of each of the leads is flush with two adjacent sides of the device, and includes a dimple therein such that the leads are wettable.

Figure 1A:
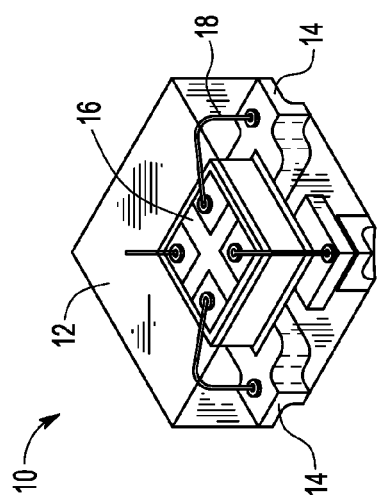
FIGS. 1A and 1B are a see-through front isometric view, and a bottom isometric view of a semiconductor device in accordance with an embodiment of the present invention.
Figure 1B:
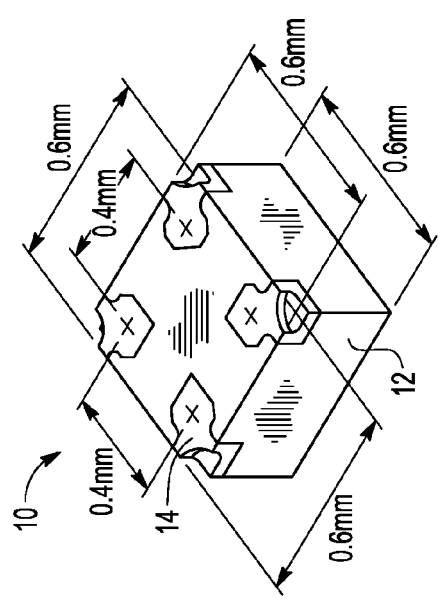

Referring now to FIGS. 1A and 1B, a semiconductor device 10 in accordance with a preferred embodiment of the present invention is shown. FIG. 1A is a see-through front isometric view, and FIG. 1B is a bottom isometric view of the semiconductor device 10. The device 10 is generally rectangular in shape and also is generally very small. For example, in one embodiment the device 10 is on the order of 0.6 mm×0.6 mm (L×W).

The device 10 has a body 12 formed from a mold compound and four leads 14. The body 12, in this embodiment, is generally square shaped and the leads 14 are exposed at the four corners of the bottom and side surfaces of the device 10. The leads 14 also are flush with the bottom and side surfaces of the device 10 and include a dimple at the corner, which facilitates wicking of solder when the device 10 is attached to a substrate or circuit board (not shown). In one embodiment, the leads 14 are spaced from each other by about 0.4 mm.

As can be seen in FIG. 1A, the device 10 also comprises a semiconductor die 16 that is mounted on and attached to the leads 14. Bonding pads of the die 16 are electrically connected to the leads 14, in this embodiment, with bond wires 18. In other embodiments, the die 16 could comprise a flip-chip die having bumps on its bonding pads such that the die can be electrically connected to the leads 14 by placing the die bonding pads in contact with the leads 14. The die 16, bond wires 18, and portions of the leads 14 are encapsulated by the mold compound of the body 12.

Figure 2:
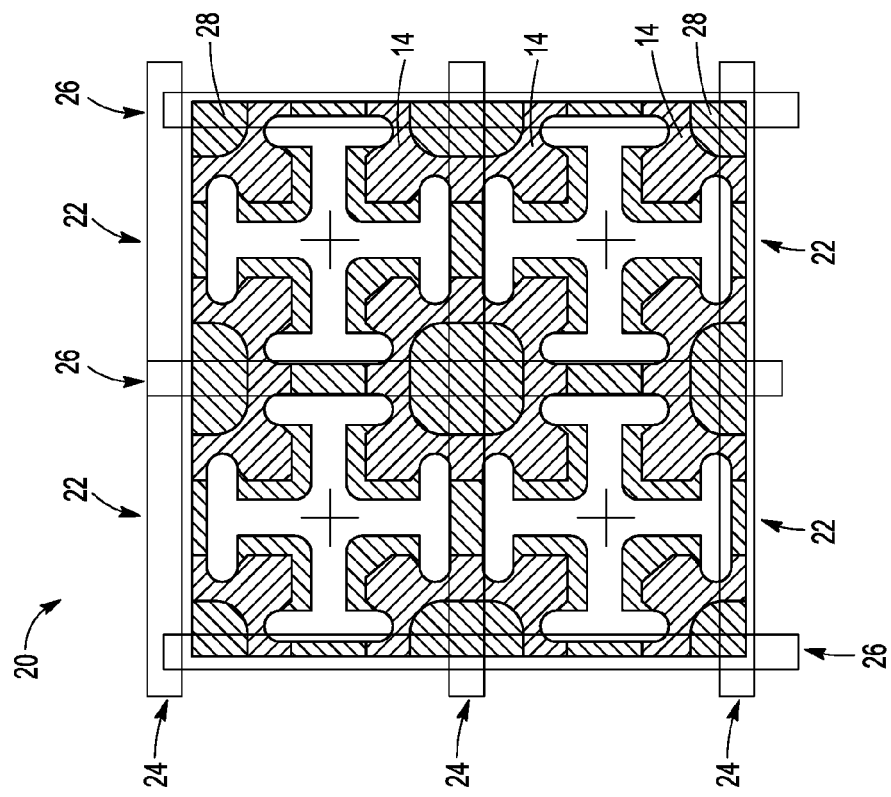
FIG. 2 is a top plan view of a lead frame array used to assemble the device of FIGS. 1A-1B.

FIG. 2 shows a portion of a lead frame array 20 used to assemble the device 10, with four individual lead frames 22 being shown. The lead frames 22 are separated from each other by saw streets 24, which run in the X-direction, and saw streets 26, which run in the Y-direction. Each of the lead frames 22 comprises four of the leads 14, which extend from the corners of the lead frames towards the centers thereof. At the saw streets 24, 26, the individual leads 14 extend to the corners of the frame such that each lead 14 abuts two adjacent, perpendicular saw streets. The lead frame array 20 may be formed from a sheet of conductive metal, such as copper, and may be pre-plated (PPF) or post-plated with Sn on either the PPF or Cu surface. The lead frame array 20 also is etched at the outer corners of the leads 14 to form dimples 28 therein. A dimple depth generally is one-half of the lead frame thickness following a standard lead frame half etching process. The leads 14 and lead frames 22 are sized and shaped to receive the die 16. In the embodiment shown the die 16 is mounted on and attached to the leads 14. In other embodiments, the lead frames 22 may include die flags for receiving and supporting the die 16. Lead frame arrays formed from a sheet of copper, etching of lead frame arrays, and plating of lead frame arrays are known in the art so further description is not necessary for a complete understanding of the present invention.

Figure 3B:
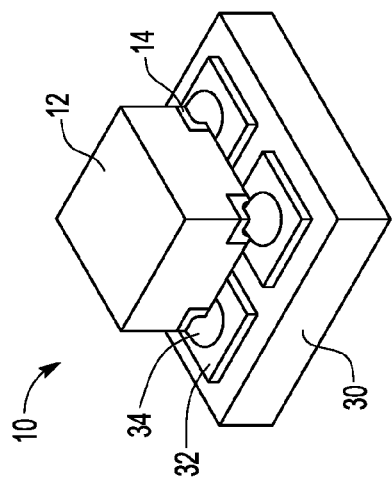
FIGS. 3A, 3B and 3C are a front elevational view, a top plan view, and a side view illustrating the device of FIGS. 1A-1C being attached to a substrate.
Figure 3C:
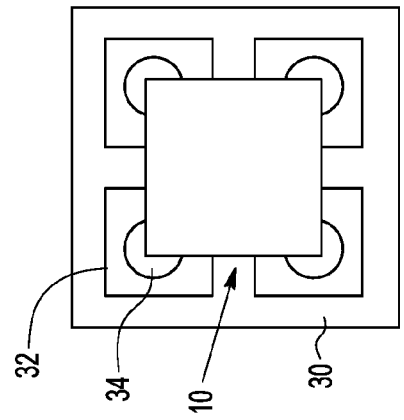
Figure 3A:
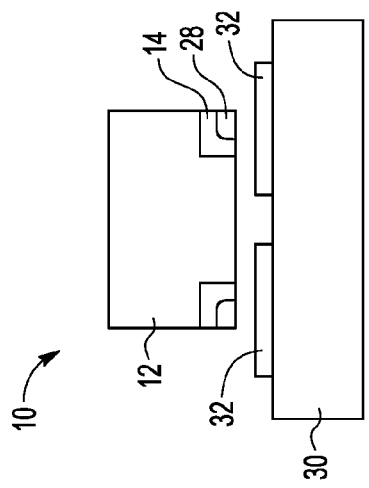

Referring now to FIG. 3A, a side view of the device 10 being mounted on a substrate 30 is shown. The substrate 30 may comprise a printed circuit board (PCB) having internal metal traces for connecting devices mounted thereon to each other, as is known in the art. The substrate 30 includes pads 32 to which the leads 14 of the device 10 will be electrically connected. FIG. 3B is an isometric view of the device 10 mounted on the substrate 30 with the leads 14 electrically connected to the substrate pads 32 with solder 34. The solder 34 contacts the leads 14 and fills the dimple 28. FIG. 3C is a top plan view of the device 10 attached to the substrate 30. As can be seen, it is relatively easy to visually inspect the solder joints that couple the device 10 to the substrate 30.

Figure 4:
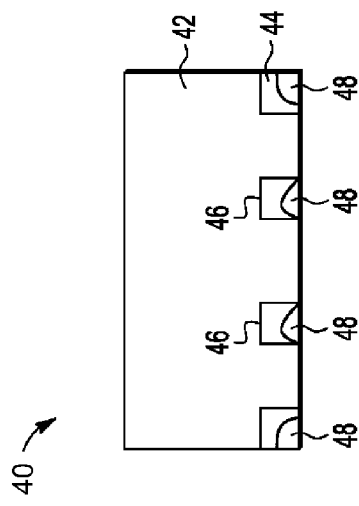
FIG. 4 is a side elevational view of a semiconductor device in accordance with another embodiment of the invention.

FIG. 4 is a side elevational view of a packaged semiconductor device 40 in accordance with another embodiment of the present invention. The device 40 is similar to the device 10 and includes a body 42 formed from a mold compound that encapsulates a semiconductor die (not shown). The device 40 has corner leads 44 that are flush with the sides of the body 42 and are exposed at two adjacent sides and a bottom surface of the device 10. The device 40 also has leads 46 that are exposed on only one side and the bottom surface of the device 40. Both of the corner leads 44 and the side leads 46 include dimples 48 for receiving solder when the device 40 is attached to a substrate or circuit board.

Figure 5:
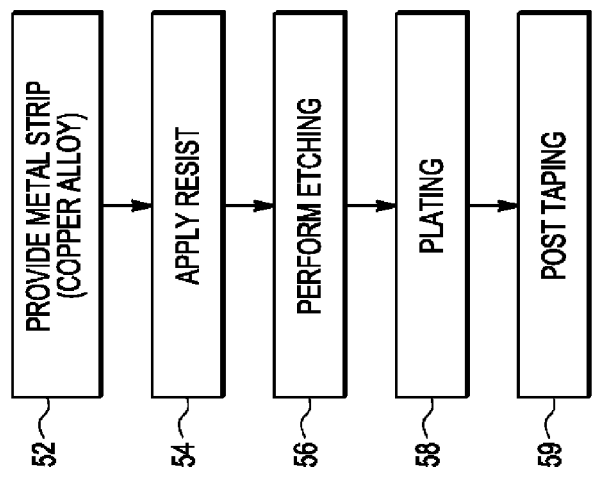
FIG. 5 is a flow chart illustrating a method of manufacturing a lead frame in accordance with an embodiment of the invention.

FIG. 5 is a flow chart illustrating a method 50 of manufacturing a lead frame or an array of lead frames like the lead frame array 22 shown in FIG. 2.

At step 52, a sheet of conductive metal, such as copper is provided. At step 54, a resist is applied to the metal sheet and then at step 56 the metal sheet is half-etched to form one or more lead frames (e.g., an array of lead frames). In accordance with the present invention, the lead frames include corner leads, like the lead frames 22 shown in FIG. 2. The lead frames are separated by saw streets that extend in both the X-axis and Y-axis directions. Dimples are formed in the leads at step 56, like the dimples 28 and 48 shown in FIGS. 2 and 4. After the lead frames have been half-etched, a plating step 58 may be performed to plate the leads such as Pd or Ag to prevent corrosion. The plating step 58 can plate the entire lead frame or only selected portions thereof, as desired. The plating step 58 preferably is performed using an electro-plating or electro-deposition process during which the lead frames including the ends or edges of the leads 44a, 44b are coated with a solderable layer such as Nickel/Palladium/Gold. During the plating process, the leads may be connected to a source of electrical potential so that they will form a cathode during the electro-plating or electro-deposition process. The electro-plating or electro-deposition process results in a conductive, wettable metal layer being deposited onto the exposed surfaces of the lead frame. The plating layer imparts solderability or solder wettability during a soldering process such as SMT (surface mount technology) as well as protecting the exposed surfaces of the lead frame from corrosion. It should be noted that the lead frame may comprise bare copper or the lead frame may be pre-plated such as with silver at the bond surface (back side typically remains as bare copper) and a coating of tin or tin alloy may be applied to the exposed lead ends before or after cutting the lead frame into individual semiconductor devices. At step 59, the lead frame or lead frame array is taped—that is, a layer of tape is applied the backside of the lead frame. The tape prevents the lead frames from being deformed prior to use. The method 50 typically is performed by a lead frame supplier. However, the method 50 also could be performed at a test and assembly facility.

Figure 6:
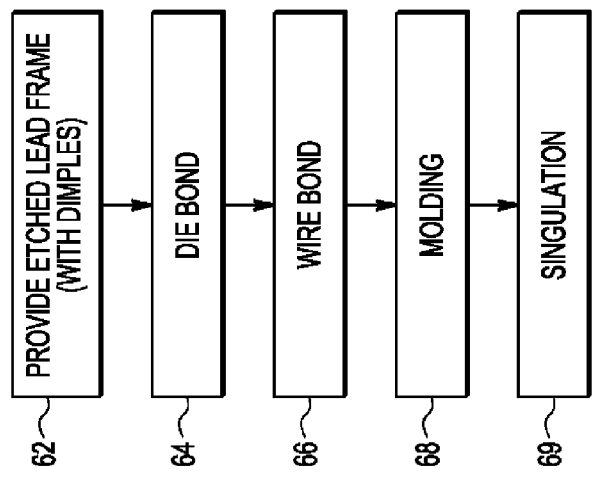
FIG. 6 is a flow chart illustrating a method of assembling a semiconductor device in accordance with an embodiment of the present invention.

FIG. 6 is a flow chart illustrating a method 60 of assembling a semiconductor device such as the semiconductor devices 10 and 40.

The method starts with a step 62 of being provided with a lead frame, such as the pre-plated lead frame array shown in FIG. 2. The provided lead frames include dimples in the portions of the leads that will be exposed after assembly. At step 64 a die is mounted on and attached to the leads of a lead frame, such as the lead frames made in accordance with the method 50. In a presently preferred embodiment, the corners of the non-active side of the die rest on and are attached to inner portions of the leads. A die attach adhesive or double-sided tape may be used to attach the die to the leads.

Step 64 is followed by a wire bonding step 66, where die bonding pads are electrically connected to respective ones of the leads with bond wires. In an alternative embodiment, the die may be a flip-chip die and have solder bumps on the die bond pads and then the die is mounted on the lead frame with the die active side facing the lead frame such that the die bond pads are in direct contact with the leads.

The wire bonding step 66 is followed by an encapsulation or molding step 68 in which the lead frame, die and bond wires are covered with a mold compound, as is known in the art. The molding step 68 preferably comprises a mold array process (MAP) where several assemblies formed on a lead frame array are all molded at the same time. After the molding step 68, laser marking is performed and if there is a tape on a bottom surface of the lead frame array, then the tape is removed in a de-taping step. Then the assemblies are separated from each other in a singulation step 69 in which a saw blade is run along the saw streets, thereby cutting and separating the simultaneously assembled devices from each other. The singulated QFN (Quad Flat No lead) devices may then be inspected and packed for shipment.

As is evident from the foregoing discussion, the present invention provides a method of producing a flank wettable semiconductor device. While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as defined in the claims.

The invention claimed is:

1. A method of assembling a flank wettable semiconductor device, comprising:
   providing an array of rectangular lead frames, wherein individual lead frames are separated by a plurality saw streets, wherein each lead frame has leads that extend to corners of the lead frame such that each corner lead has an end that abuts two adjacent, perpendicular saw streets of the plurality of saw streets, and wherein each corner lead has a dimple formed at an outer surface thereof;
   mounting and attaching semiconductor dies to respective ones of the lead frames;
   electrically connecting bond pads on the dies with each die on a different one of the leads of the lead frames upon which the dies are mounted;
   encapsulating the dies and the electrical connections with a mold compound;
   cutting the lead frame array along the plurality of saw streets to separate individual devices from adjacent devices, whereby each device has corner bond pads that are flush with the mold compound thereof and wherein the dimples of each corner lead are exposed after the cutting.

2. The method of claim 1, further comprising applying a coating metal or metal alloy to exposed lead ends of the leads prior to cutting the lead frame into individual semiconductor devices.

3. The method of claim 2, wherein the metal coating is applied by electro-plating or electro-deposition.

4. The method of claim 3, wherein the coating metal or metal alloy comprises tin or a tin alloy.

5. The method of claim 1, wherein the step of electrically connecting comprises attaching bond wires to the die bonding pads and respective ones of the leads.

6. The method of claim 1, wherein non-active sides of the dies are attached to the leads of each of the respective lead frames.

7. The method of claim 1, wherein each individual lead frame has four of the corner leads, each of which extends to a separate corner thereof.

8. The method of claim 7, wherein each individual lead frame includes one or more additional leads disposed on a side of the semiconductor device between the corner leads on said side.

9. A semiconductor device assembled by the method of claim 1.

10. A flank wettable semiconductor device, comprising:
    a lead frame including a plurality of leads;
    a semiconductor die mounted on the lead frame, wherein bonding pads on the die are electrically connected to respective ones of the leads;
    a mold compound that encapsulates the die, the leads and the electrical connections, wherein ends of the leads are exposed at corner side walls of the device, and
    wherein the exposed portion of each of the leads is flush with two adjacent sides of the device, and includes a dimple therein such that the leads are wettable.

11. The semiconductor device of claim 10, further comprising a coating of a protective metal or metal alloy on the exposed portions of the leads.

12. The semiconductor device of claim 11, wherein the coating comprises a tin or tin alloy.

13. The semiconductor device of claim 11, wherein the coating is applied to the exposed portions of the leads by electro-plating or electro-deposition prior to the device being separated from an adjacent device during assembly.

14. The semiconductor device of claim 10, further comprising a plurality of bond wires that electrically connect the die bonding pads with the leads.

* * * * *